United States Patent [19]

Sameshima et al.

[11] Patent Number: 5,726,487
[45] Date of Patent: Mar. 10, 1998

[54] SEMICONDUCTOR DEVICE HAVING AN IMPROVED THIN FILM TRANSISTOR

[75] Inventors: Toshiyuki Sameshima; Masaki Hara; Naoki Sano; Dharam Pal Gosain; Setsuo Usui, all of Kanagawa, Japan

[73] Assignee: Sony Corporation, Tokyo, Japan

[21] Appl. No.: 331,273

[22] Filed: Oct. 28, 1994

Related U.S. Application Data

[63] Continuation of Ser. No. 36,285, Mar. 24, 1993, abandoned.

[30] Foreign Application Priority Data

Mar. 30, 1992 [JP] Japan ................................. 4-074577

[51] Int. Cl.[6] ........................ H01L 29/76; H01L 29/22; H01L 31/117
[52] U.S. Cl. .................... 257/616; 257/67; 257/77; 257/78; 257/190; 257/191; 257/192
[58] Field of Search ........................ 257/67, 77, 78, 257/190, 191, 192, 55, 19, 616

[56] References Cited

U.S. PATENT DOCUMENTS

| | | | |
|---|---|---|---|
| 4,598,305 | 7/1986 | Chiang et al. | 357/23.7 |
| 4,994,866 | 2/1991 | Awano | 357/16 |
| 5,221,365 | 6/1993 | Noguchi et al. | 136/258 |
| 5,241,193 | 8/1993 | Pfiester et al. | 257/67 |
| 5,241,197 | 8/1993 | Murakami et al. | 257/192 |
| 5,250,818 | 10/1993 | Saraswat et al. | 257/616 |

Primary Examiner—Sara W. Crane
Assistant Examiner—Valencia Martin Wallace
Attorney, Agent, or Firm—Hill, Steadman & Simpson

[57] ABSTRACT

The present invention is directed to a thin film transistor (TFT) structure having a channel region formed of a crystallized SiGe and is to provide a thin film transistor having a large carrier mobility. In this case, a channel region (4) is formed of a crystallized SiGe thin film.

6 Claims, 3 Drawing Sheets

SEMICONDUCTOR DEVICE HAVING AN IMPROVED THIN FILM TRANSISTOR

This is a continuation of application Ser. No. 08/036,285, filed Mar. 24, 1993 now abandoned Dec. 27, 1994.

BACKGROUND OF THE INVENTION

1. Field of the Invention

The present invention relates to a thin film transistor in which a channel region is formed of a crystallized SiGe film and a manufacturing method thereof.

2. Description of the Related Art

A thin film transistor (TFT) made of polycrystalline silicon (Si) can be easily formed on a substrate such as a glass or the like by some suitable means such as the irradiation of laser beams, the heating using an electric heating furnace or the like after an amorphous silicon film was formed by a chemical vapor deposition (CVD) or the like. The thin film transistor made of polycrystalline silicon has a carrier mobility of 50 to 100 (cm$^2$/Volt·Second) which is extremely small and about ⅙ of that of a thin film transistor made of single crystal silicon. Therefore, a high speed circuit whose switching speed is higher than 10 MHz cannot be manufactured by using such polycrystalline silicon thin film transistor.

To remove the aforesaid shortcomings, there are proposed a wide variety of techniques such as to increase a carrier mobility of a thin film transistor by increasing a grain size of active region formed of polycrystalline silicon film, for example.

A technique in which a semiconductor thin film such as a an amorphous silicon hydride (a-Si:H), an amorphous germanium hydride (a-Ge:H) or the like is melted and crystallized by the irradiation of pulse laser beams in a variety of semiconductor integrated circuits receives remarkable attention as a technique that can manufacture thin film transistors having large carrier mobility at low temperature. Various researches have hitherto been made in order to establish a technique in which thin film transistors can be manufactured at low temperature according to the pulse anneal treatment.

OBJECTS AND SUMMARY OF THE INVENTION

Therefore, it is an object of the present invention to provide an improved thin film transistor and an improved method of manufacturing the thin film transistor in which the aforesaid shortcomings and disadvantages encountered with the prior art can be eliminated.

More specifically, it is an object of the present invention to provide a thin film transistor structure which includes a channel region whose carrier mobility is remarkably large as compared with that of a polycrystalline silicon.

It is another object of the present invention to provide a method of manufacturing the thin film transistor.

According to an aspect of the present invention, there is provided a thin film transistor which is characterized in that a channel region is formed of a crystallized SiGe film.

According to another aspect of the present invention, there is provided a method of manufacturing a thin film transistor which comprises the steps of depositing a channel region formed of an amorphous SiGe thin film on a substrate and irradiating energy beams on the channel region to crystallize the SiGe thin film.

The above and other objects, features, and advantages of the present invention will become apparent from the following detailed description of illustrative embodiments thereof to be read in conjunction with the accompanying drawings, in which like reference numerals are used to identify the same or similar parts in the several views.

DETAILED DESCRIPTION OF THE PREFERRED EMBODIMENTS

Prior to the description of the embodiment of the present invention, a fundamental principle of the present invention will be described briefly below.

Figure 1:
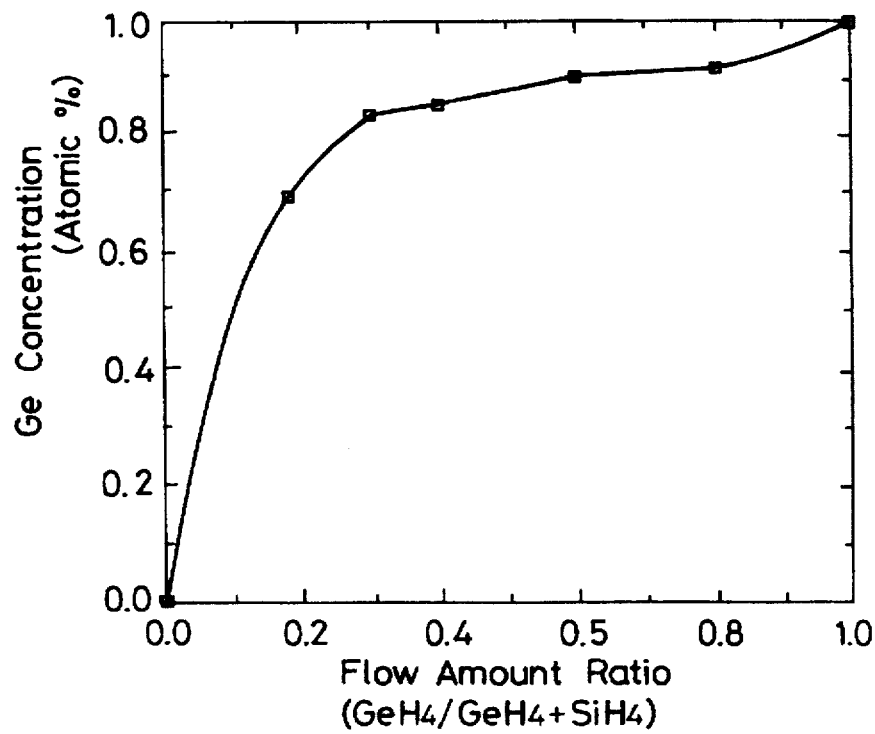
FIG. 1 is a graph showing the change of Ge concentration relative to a flow amount ratio of GeH$_4$.

A thin film transistor of the present invention has a channel region made of crystallized SiGe. According to this structure, a carrier mobility at temperature 300 K could be considerably increased to about 1700 cm$^2$/Volt. Second. Inventors of the present invention had manufactured polycrystalline SiGe films while concentration of germanium (Ge) was changed, and measured carrier mobility characteristic of the products. Initially, a mixed gas of monosilane SiH$_4$ and germanium hydride GeH$_4$ was decomposed by a plasma CVD and an amorphous SiGe hydride film (a-SiGe:H) was deposited on a glass substrate. FIG. 1 of the accompanying drawings shows a relationship between a flow amount ratio GeH$_4$/(GeH$_4$+SiH$_4$) of GeH$_4$ and a concentration of Ge in the film thus formed. Study of measured results in FIG. 1 reveals that, even when the flow amount ratio of GeH$_4$ is relatively small, the concentration of Ge in the film becomes relatively large. The reason for this is that a decomposition ratio of GeH$_4$ is as large as about ten times that of SiH$_4$.

Figure 2:
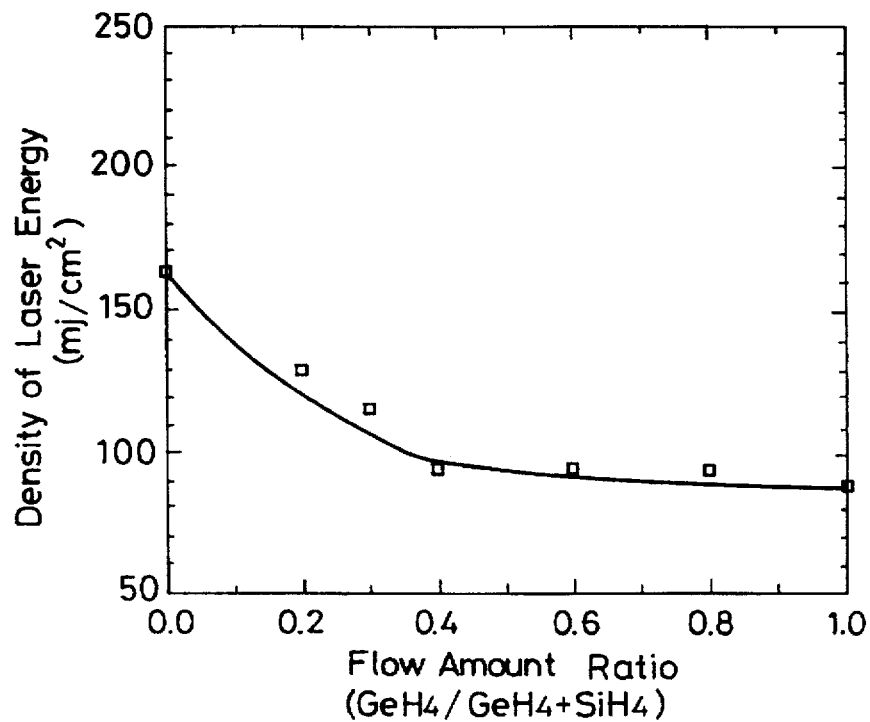
FIG. 2 is a graph showing a relationship between the flow amount ratio of GeH$_4$ and the crystallization energy density.

When the 12 nm-thick SiGe film thus formed was irradiated with XeCl excimer laser beam having a wavelength of 308 nm and a pulse width of 30 ns, the film was melted and crystallized. A crystallized threshold value energy was lowered with an increase of the Ge flow amount ratio GeH$_4$/(GeH$_4$+SiH$_4$) as shown in FIG. 2. The reason for this was that a melting point of SiGe is lowered with an increase of the containing amount of Ge.

Figure 3:
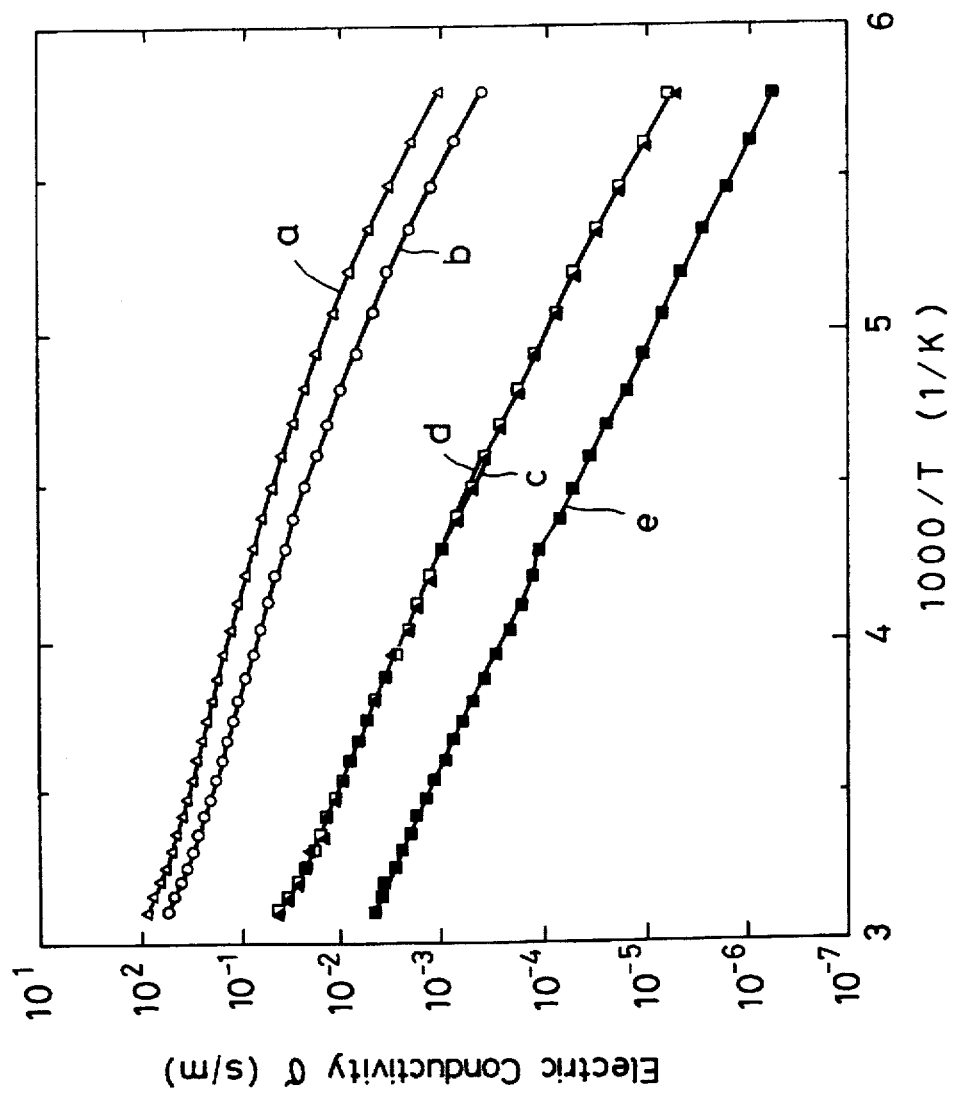
FIG. 3 is a characteristic graph showing a temperature dependency of electric conductivity of a crystallized SiGe film.

FIG. 3 shows measured results of a temperature dependency of electric conductivity of the crystallized SiGe film. Solid lines a to e in FIG. 3 show measured results obtained when the Ge flow amount ratio (GeH$_4$/(GeH$_4$+SiH$_4$) was selected to be 0.8, 0.6, 0.4, 0.3 and 0.18, respectively. Study of FIG. 3 reveals that, when the GeH$_4$ flow amount ratio was selected in a range of from 0.18 to 0.4 (shown by the solid lines c, d and e in FIG. 3), a logarithm of electric conductivity and a reciprocal number of temperature present a substantially proportion relationship. From the characteristic graph of FIG. 3, an activation energy is calculated and a value twice the activation energy becomes a band gap of the crystallized SiGe film.

Assuming that an effective mass of hole and electron in the SiGe film is the same as an electron mass m, then a carrier concentration n at temperature T is calculated from the following equation (1):

$$n = 2 \left( \frac{KT}{2\pi\hbar^3} \right)^{3/2} \cdot m^{3/2} e^{-Eg/2KT} \quad (1)$$

where k is the Boltzmann's constant, η the action amount (Planck's constant), m the electron mass, e the electric charge and Eg the energy gap.

On the basis of measured results of electric conductivity σ and the carrier concentration n, a carrier mobility μ is calculated by the following equation (2):

$$\mu = \sigma(300\ K)/e \cdot n \quad (2)$$

The following table 1 shows measured results of the carrier mobility of the crystallized SiGe film with respect to respective Ge concentrations. From the table 1, it is clear that the largest carrier mobility, i.e., 1700 cm²/Volt. second could be obtained when the flow rate of GeH₄ was 0.3, i.e., the concentration in the Ge film was 0.8. This value is larger than a carrier mobility (1300 cm²/Volt. second) of a bulk crystal silicon at room temperature.

TABLE 1

| Flow amount ratio (GeH₄/(GeH₄ + SiH₄)) | Concentration of Ge [atomic %] | Activation energy [eV] | Carrier mobility (300K) [cm²/Vs] |
|---|---|---|---|
| 0.18 | 70 | 0.35 | 500 |
| 0.3 | 80 | 0.335 | 1700 |
| 0.4 | 82 | 0.33 | 1400 |

Study of measured results on the above table 1 reveals that the SiGe film having high carrier mobility could be obtained when the amorphous SiGe hydride (a-SiGe:H) film was irradiated with energy beams such as the excimer laser or the like.

When the channel region is constructed by the SiGe film having high carrier mobility, an on-current can be increased in the thin film transistor of the present invention.

Further, in the thin film transistor, at least the drain region is made of material such as a crystallized Si, a crystallized SiC or the like having a relatively large band gap, whereby an off-current can be reduced. Therefore, characteristics of the thin film transistor can be improved.

As described above, the crystallized Si thin film can be formed by the irradiation of energy beams through a manufacturing process at relatively low temperature easily and positively without a heating process such as an ordinary electric heating furnace or the like.

The thin film transistor according to the embodiment of the present invention and the manufacturing method thereof will now be described in detail. The present invention is applied to the manufacturing process of a so-called top gate type (planar type) thin film transistor in which a gate electrode is derived upwardly.

Figure 4:
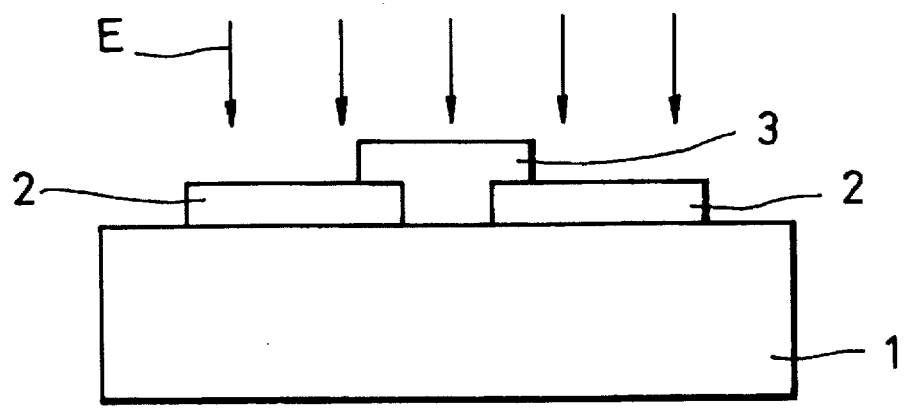
FIG. 4 is a manufacturing process diagram used to explain a method of manufacturing a thin film transistor according to the present invention.

FIG. 4 shows an example of a manufacturing process according to the present invention. As shown in FIG. 4, a P-doped amorphous Si layer 2 is deposited on a substrate 1 made of glass, SiO₂ or the like according to the ordinary CVD, e.g., plasma CVD. Then, regions in which source and drain regions are to be formed are formed by means of the patterning process with the application of photolithography technique, and a portion that serves as a channel region is removed. Then, a p-type or intrinsic amorphous SiGe layer 3 is deposited on the whole surface by the CVD or the like, whereafter only the portion in which the channel region is to be formed is formed by means of the patterning process with the application of photolithography technique. Then, the Si layer 2 and the SiGe layer 3 are crystallized by irradiating energy beams E such as the XeCl excimer laser beam or the like on these layers 2 and 3.

Figure 5:
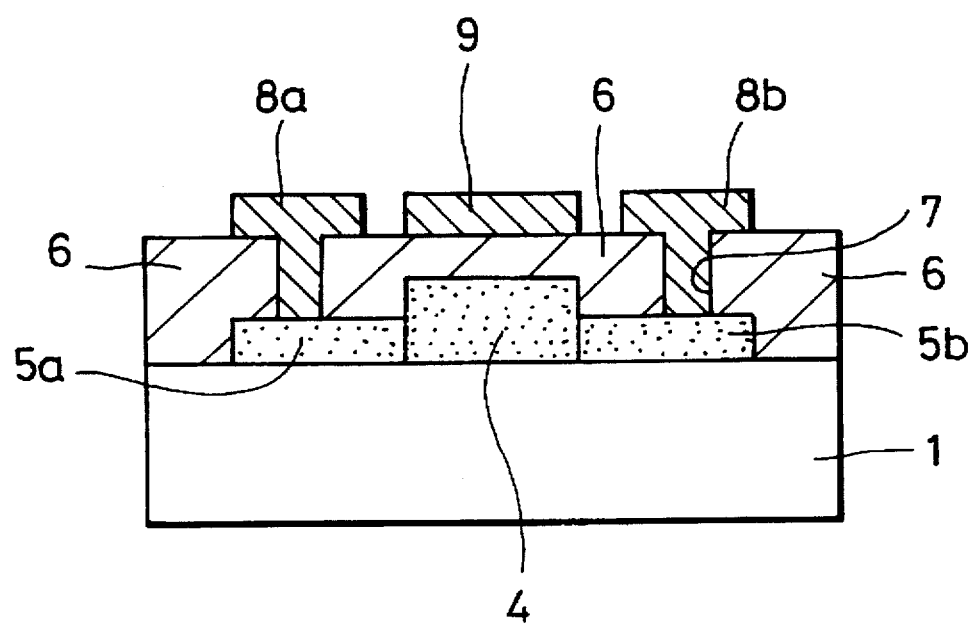
FIG. 5 is a cross-sectional view showing an example of a thin film transistor according to the present invention in an enlarged scale.

An insulating layer 6 such as SiO₂ or the like is deposited thereon by the CVD or the like as shown in FIG. 5. Thereafter, contact holes 7 that reach source and drain regions 5a, 5b made of the crystallized Si layer are bored at predetermined positions by the photolithography technique to thereby form source and drain electrodes 8a, 8b made of Al, Mo, Cr or the like. Further, a gate electrode 9 is formed on a channel region 4 made of crystallized SiGe by the patterning process. Thus, a hetero-structure type thin film transistor can be obtained.

In this thin film transistor, when a plus voltage was applied to the gate electrode 9, by selecting the Ge concentration to be about 80 atomic %, there could be obtained a high carrier mobility of about 1700 cm²/Volt. Second. As compared with the carrier mobility (50 cm²/Volt. Second) of the conventional thin film transistor formed of ordinary polycrystalline Si, the carrier mobility of the thin film transistor of the present invention can be increased considerably about one to two figures. Therefore, the on-current that is proportional to the carrier mobility can be increased about one to two figures.

When a minus voltage is applied to the gate electrode 9, hole electric charges are accumulated in the channel region 4. In this case, the injection of holes is suppressed by a potential barrier formed between the channel region 4 made of SiGe and the source and drain regions 5a and 5b made of n⁺Si, whereby a leakage current can be suppressed.

Further, in this case, since the source and drain regions 5a and 5b are formed of Si whose band gap is very large, i.e., about 1.2 eV as compared with the band gap (0.67 eV) of the SiGe film, the off-current can be reduced. More specifically, a ratio between the on-current and the off-current can be increased to about 10⁶ to 10⁷, which is about 1 to two figures as compared with that of the conventional polycrystalline silicon TFT. Therefore, the thin film transistor of the present invention is suitable for use in liquid crystal display or the like.

Furthermore, according to the manufacturing method of the present invention, since the SiGe crystallized film can be formed with irradiation of energy beams, e.g., laser beams, the thin film transistor can be manufactured via a manufacturing process of a relatively low temperature without the electric furnace heating process or the like unlike the conventional polycrystalline silicon TFT.

While the present invention is applied to the top gate type (planar type) thin film transistor as described above, the present invention is not limited thereto and may be applied to a variety of thin film transistors such as a bottom gate type (reverse planar type) thin film transistor, a dual gate type thin film transistor or the like. Also, in the present invention, various modifications and variations could be effected therein so that the source and drain regions are formed of the SiGe layer or that an opposite conductivity type, i.e., p-channel structure can be made.

According to the thin film transistor of the present invention, the on-current can be increased and the off-current can be reduced, thereby improving the transistor characteristics.

According to the manufacturing method of the present invention, without using the heating process such as the electric furnace heating or the like, the thin film transistor can be manufactured easily and reliably by the manufacturing process of relatively low temperature.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A semiconductor device comprising:

an insulating substrate;

a thin film transistor formed on the insulating substrate, the thin film transistor having a channel region of a crystallized SiGe layer converted from an amorphous SiGe layer; and a drain region formed of a crystallized Si or a crystallized SiC.

2. The semiconductor device according to claim 1 wherein said crystallized SiGe layer is an intrinsic crystallized SiGe layer.

3. The semiconductor device according to claim 1 wherein said drain region is formed of a crystallized Si or a crystallized SiC having an impurity of a first conductivity type.

4. The semiconductor device according to claim 1 wherein said crystallized SiGe layer comprises a polycrystalline SiGe layer.

5. The semiconductor device according to claim 1 including an insulating layer deposited on said insulating substrate.

6. The semiconductor device according to claim 1 including a drain electrode.

* * * * *